US006909587B2

(12) United States Patent
Sonoda

(10) Patent No.: US 6,909,587 B2
(45) Date of Patent: Jun. 21, 2005

(54) APPARATUS HAVING A STATIC ELIMINATOR FOR MANUFACTURING SEMICONDUCTOR DEVICES AND A METHOD FOR ELIMINATING A STATIC ELECTRICITY ON A SEMICONDUCTOR WAFER

(75) Inventor: Akihiro Sonoda, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 131 days.

(21) Appl. No.: 10/147,823

(22) Filed: May 20, 2002

(65) Prior Publication Data

US 2002/0137364 A1 Sep. 26, 2002

Related U.S. Application Data

(62) Division of application No. 09/635,575, filed on Aug. 9, 2000, now Pat. No. 6,432,727.

(30) Foreign Application Priority Data

Sep. 6, 1999 (JP) .......................................... 11/251719

(51) Int. Cl.[7] .............................................. H05F 3/00
(52) U.S. Cl. ........................ 361/213; 361/222; 361/234
(58) Field of Search ................................ 361/213, 222, 361/234; 279/128; 250/49.21, 49.1

(56) References Cited

U.S. PATENT DOCUMENTS

| 3,578,739 A | * | 5/1971 | George .......................... 18/8 |
| 4,086,650 A | | 4/1978 | Davis et al. |
| 4,652,318 A | * | 3/1987 | Masuda et al. ............... 156/89 |
| 5,134,301 A | * | 7/1992 | Kamata et al. .......... 250/492.2 |
| 5,316,970 A | | 5/1994 | Batchelder et al. |
| 5,383,783 A | | 1/1995 | Ishimori |
| 5,494,522 A | * | 2/1996 | Moriya et al. ............... 118/719 |
| 5,516,369 A | | 5/1996 | Lur et al. |
| 5,790,365 A | * | 8/1998 | Shel ........................... 361/234 |
| 5,851,298 A | * | 12/1998 | Ishii ...................... 219/121.43 |
| 5,880,924 A | * | 3/1999 | Kumar et al. ................ 361/234 |
| 6,136,669 A | * | 10/2000 | Flitssch et al. .............. 438/466 |

FOREIGN PATENT DOCUMENTS

JP   2-148827   *   6/1990   ........... H01L/21/27

OTHER PUBLICATIONS

Dr. Ohmi, "Break Through", Tohoku University, Apr. 1993 (Table–1, p. 26).
Stanley Wolf et al., "Silicon Processing for the VLSI Era," vol. 1: Process Technology, pp. 516–518.
Patent Abstracts of Japan—JP Patent Publication Laid–Open No. Hei 02–148827, Jun. 7, 1990.
Patent Abstracts of Japan—JP Patent Publication Laid–Open No. Hei 05–029296, Feb. 5, 1993.

* cited by examiner

Primary Examiner—Gregory J. Toatley, Jr.
Assistant Examiner—Z Kitov
(74) Attorney, Agent, or Firm—Volentine Francos, PLLC

(57) ABSTRACT

An ion generator generates ions above a semiconductor wafer and the ions are directed towards a surface of a semiconductor wafer. The ions combine with static charges on the semiconductor wafer to thereby discharge the surface of the semiconductor wafer.

7 Claims, 6 Drawing Sheets

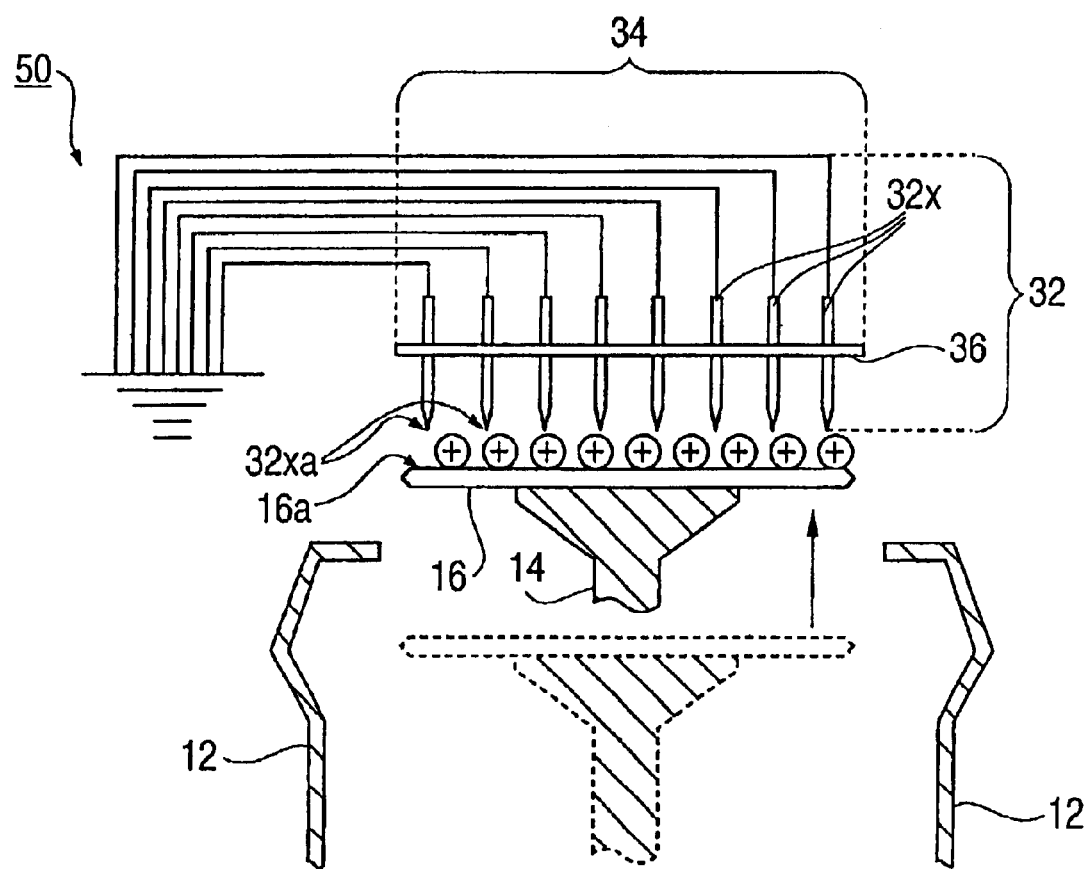

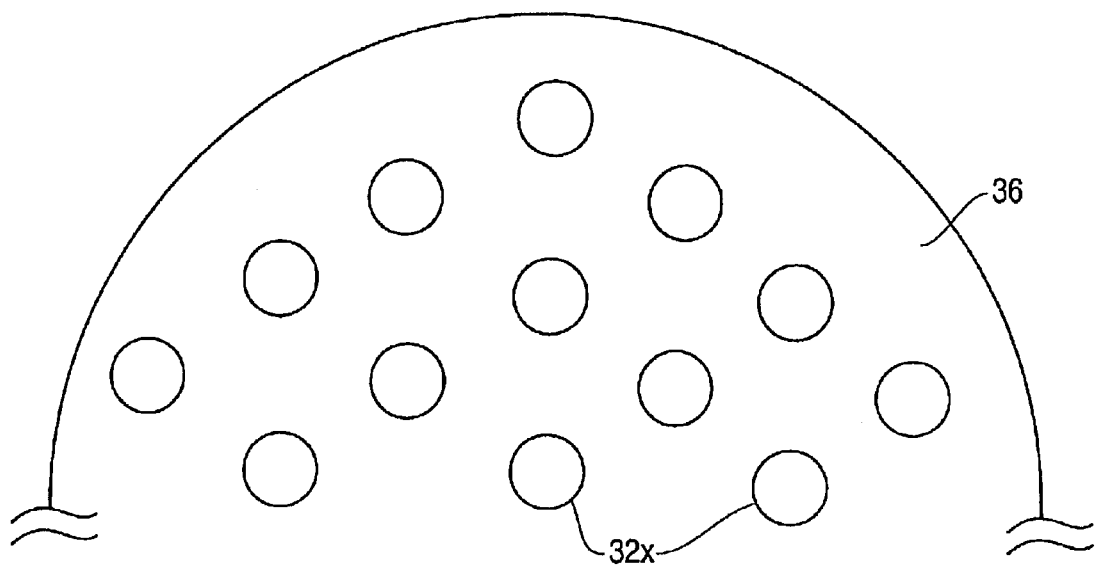

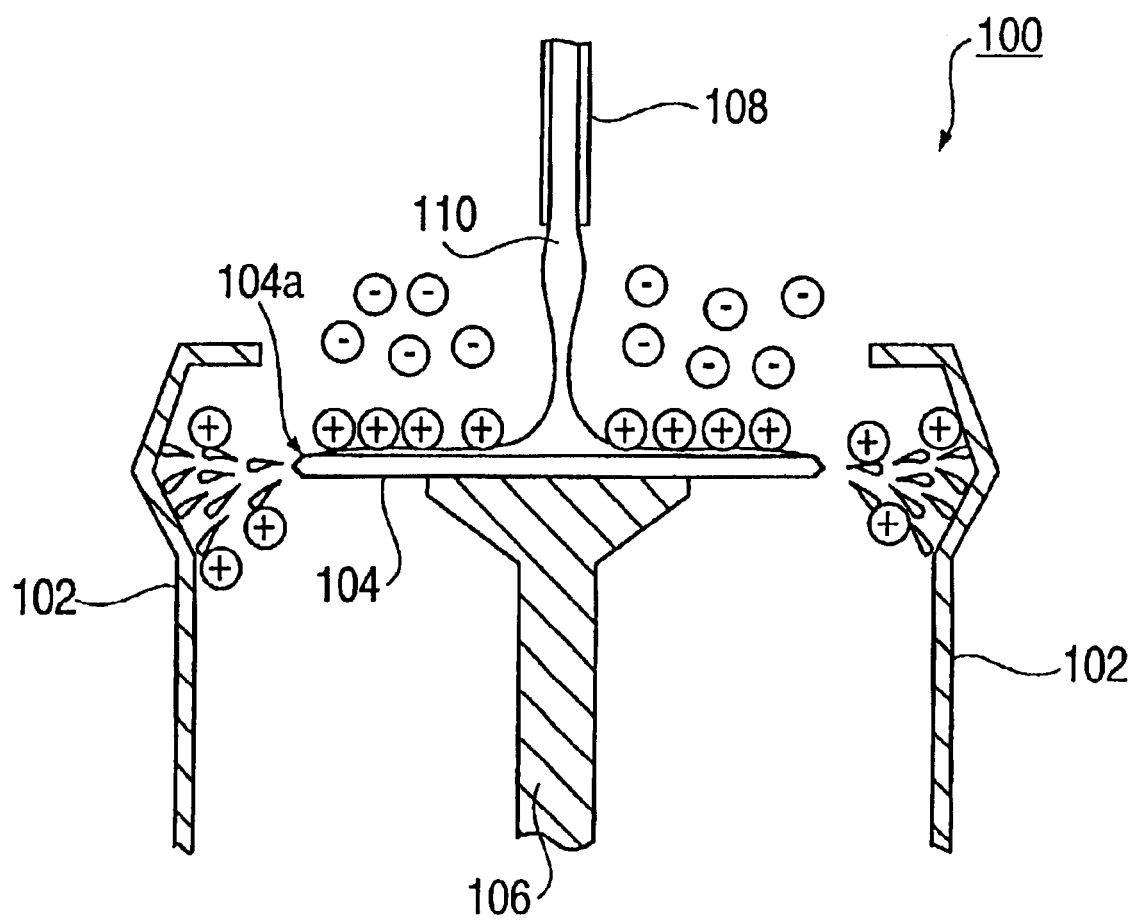

APPARATUS HAVING A STATIC ELIMINATOR FOR MANUFACTURING SEMICONDUCTOR DEVICES AND A METHOD FOR ELIMINATING A STATIC ELECTRICITY ON A SEMICONDUCTOR WAFER

CROSS-REFERENCE TO RELATED APPLICATIONS

This is a divisional of application Ser. No. 09/635,575; filed Aug. 9, 2000 now U.S. Pat. No. 6,432,727, which is incorporated herein by reference in its entirety.

FIELD OF THE INVENTION

The present invention relates to an apparatus having a static eliminator which eliminates static electricity on a semiconductor wafer and to a method for eliminating static electricity on a semiconductor wafer.

BACKGROUND OF THE INVENTION

In an exposure process of a semiconductor manufacturing process, an apparatus is used, such as a spin coater or a developer, which treats a semiconductor wafer with rotation.

Such an apparatus is shown in FIG. 6, which is a cross sectional view of certain component parts of an apparatus 100.

A support portion 106 which supports a semiconductor wafer 104 using a vacuum chuck is located in a cylindrical container 102. A nozzle 108 is arranged above the semiconductor wafer 104 so that a solution is applied to a surface 104a of the semiconductor wafer 104. When the solutions is dropped on the surface 104a, the semiconductor wafer 104 is rotated by the support portion 106. Thereby, the solution is uniformly distributed over the surface 104a.

However, as the wafer 104 is rotated at a high speed, friction occurs between the surface 104a and the dropped solution. Static electricity is generated by this friction and the surface 104a becomes positively charged. An atmosphere above the semiconductor wafer 104 is negatively charged, as shown in FIG. 6.

According to the publication entitled "BREAK THROUGH", by Dr. Ohmi at Tohoku University, which was published in April, 1993 (Table-1 at p.26), when a resist was applied to a surface of a semiconductor wafer using a similar apparatus, the surface was positively charged at 3000V or more.

Therefore, transistors in the semiconductor wafer might be destroyed and small particles might attach on the surface as a result of the static electricity, which in turn may lead to a reduced throughput and quality. Further, the finer the patterns on the semiconductor wafer, the greater the influence of the static electricity or devices of the semiconductor wafer.

SUMMARY OF THE INVENTION

An object of the invention is to provide an apparatus having a static eliminator which eliminates static electricity on a semiconductor wafer and a method for eliminating static electricity on a semiconductor wafer.

To achieve the object, in one embodiment of the present invention, ions are generated above a semiconductor wafer and the ions are combined with static electricity on the semiconductor wafer such that the static electricity may be consumed by the ions.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIG. 4 is a cross section view of an apparatus according to a fourth preferred embodiment of the present invention.

FIG. 5 is a plane view of a discharge electrode of the fourth preferred embodiment.

FIG. 6 is a cross section view of a conventional apparatus.

DESCRIPTION OF THE PREFERRED EMBODIMENTS

The present invention will be described hereinafter with reference to the accompanying drawings. The drawings used for this description typically illustrate major characteristic parts in order that the present invention will be easily understood. In this description, one embodiment is shown in which the present invention is applied to an apparatus which treats a semiconductor wafer while rotating the semiconductor wafer, such as a spin coater and a spin developer. However, the invention is not limited to such an apparatus. The present invention may be applied to a single wafer processing apparatus or a batch processing apparatus used for etching or deposition.

Figure 1:
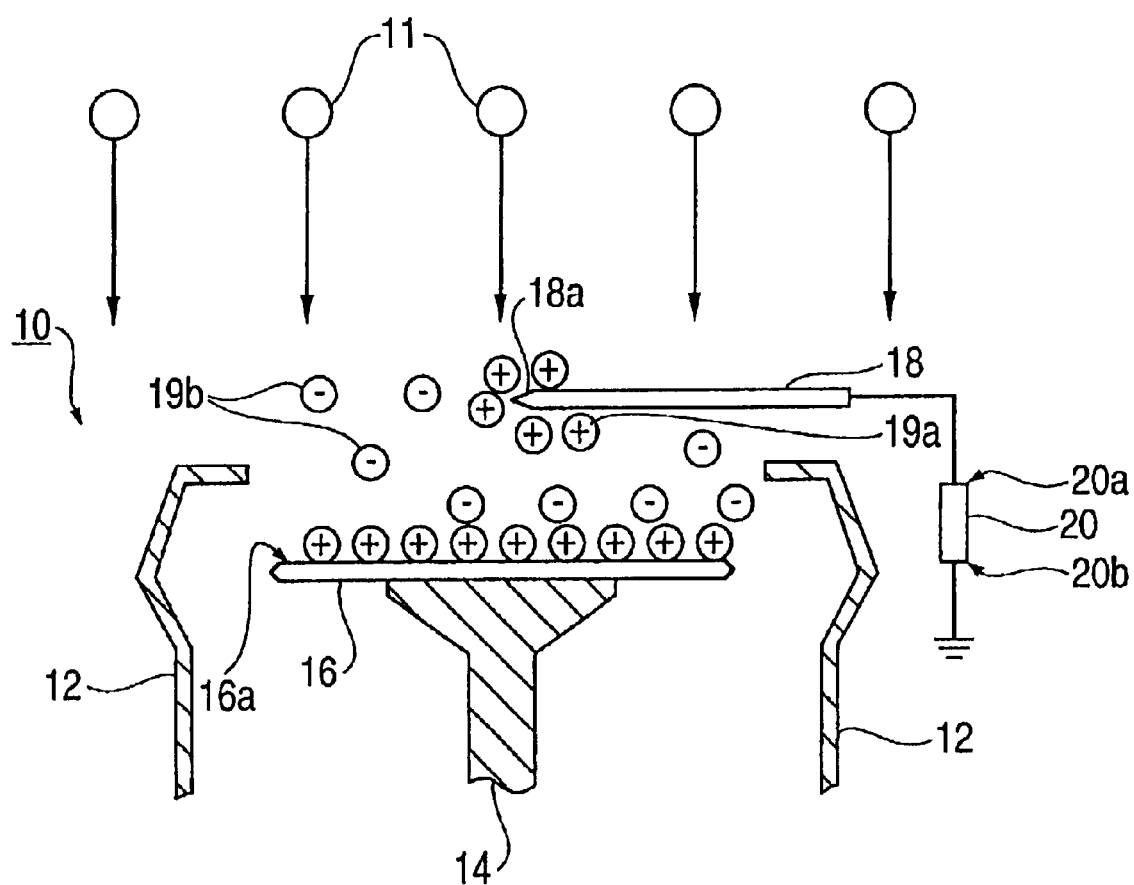
FIG. 1 is a cross section view of an apparatus according to a first preferred embodiment of the present invention.

A cross sectional view of an apparatus 10 is shown in FIG. 1. FIG. 1 illustrates an outline of the apparatus.

The apparatus 10 includes a cylindrical container 12, a support portion 14 and a down flow portion 11. The support portion 14 which supports a semiconductor wafer 16 using a vacuum chuck is located in the cylindrical container 12. A nozzle (not shown) is arranged above the semiconductor wafer 16 so that a solution is applied to a surface 16a of the semiconductor wafer 16.

The apparatus 10 is located in an atmosphere which is fluid toward a predetermined direction. In this embodiment, the predetermined direction means a direction which flows down from the down flow portion 11 to the surface 16a of the semiconductor wafer 16. In the case where the semiconductor wafer is supported perpendicularly, the predetermined direction means a horizontal direction toward to the surface of the semiconductor wafer. The atmosphere which is fluid toward the predetermined direction is formed at least above the semiconductor wafer.

The apparatus 10 includes an ion generator 18 which supplies ions into the atmosphere above the semiconductor wafer. The ions from the ion generator 18 reach the surface 16a by the flow in the atmosphere.

In this embodiment, the ion generator 18 is comprised of a thin needle type electrode. The needle type electrode 18 is sharply pointed as shown in FIG. 1. The needle type electrode 18 is connected to a first terminal 20a of a power supply 20. The power supply 20 supplies a power supply voltage to the needle type electrode 18. A second terminal 20b of the power supply 20 is connected to a ground. The power supply 20 is a dc type power supply.

The needle type electrode 18 is comprised of a conductive material which is 1 centimeters in diameter. In this embodiment, the conductive material is copper. The tip 18a of the needle type electrode 18 is located above the semiconductor wafer 16. The needle type electrode 18 can be attached to the side wall of the apparatus 10.

When a solution is dropped on the surface 16a from a nozzle (not shown), the semiconductor wafer 16 is rotated at 1000–6000 rpm by the support portion 14. As the wafer 16 is rotated at a high speed, friction occurs between the surface 16a and the dropped solution. A static electricity is generated as a result of the friction and the surface 16a becomes positively charged.

Here, the power supply 20 supplies a negative voltage to the needle type electrode 18. In this preferred embodiment, the negative voltage is between −200V and −500V. Therefore, the atmosphere around the needle type electrode 18 is ionized and a corona discharge occurs therein.

As such, positive ions 19a and negative ions 19b are generated around the needle type electrode 18. Most of the positive ions 19a gather around the needle type electrode 18 since the needle type electrode 18 is supplied with the negative voltage and a strong negative electrical field is formed around the needle type electrode 18. Part of the positive ions 19a may reach the surface 16a of the semiconductor wafer 16 as a result of the down flow in the atmosphere. However, as the surface 16a is positively charged, the positive ions 19a are repelld. The negative ions 19b are carried to the surface 16a as a result of the down flow. As the surface 16a is positively charged, the negative ions 19b are combined with positive ions on the surface 16a. Therefore, the charges are extinguished from the surface 16a. That is, the static electricity on the semiconductor wafer can be eliminated.

According to the first preferred embodiment, it is possible to eliminate the static electricity on the semiconductor wafer using the needle type electrode which is a relatively small addition to the system. That is, an apparatus having a static eliminator which eliminates a static electricity on a semiconductor wafer can be easily realized.

As the tip 18a of the needle type electrode 18 is located above the middle of the semiconductor wafer 16, most of the negative ions generated around the needle type electrode can be carried by the down flow to the surface 16a. As such, the static electricity on the surface is efficiently eliminated.

If the surface 16a of the semiconductor wafer 16 were negatively charged, the needle type electrode 18 would be supplied with a positive voltage from the power supply 20.

In the case where the support portion 14 can move up and down, the semiconductor wafer 16 is carried to the outside of the cylindrical container 12 so as to expose the surface 16a, and the charge on the surface is eliminated by the needle type electrode.

The present invention may be applied to a batch processing apparatus which simultaneously treats plural semiconductor wafers stored in a wafer cassette.

Figure 2:
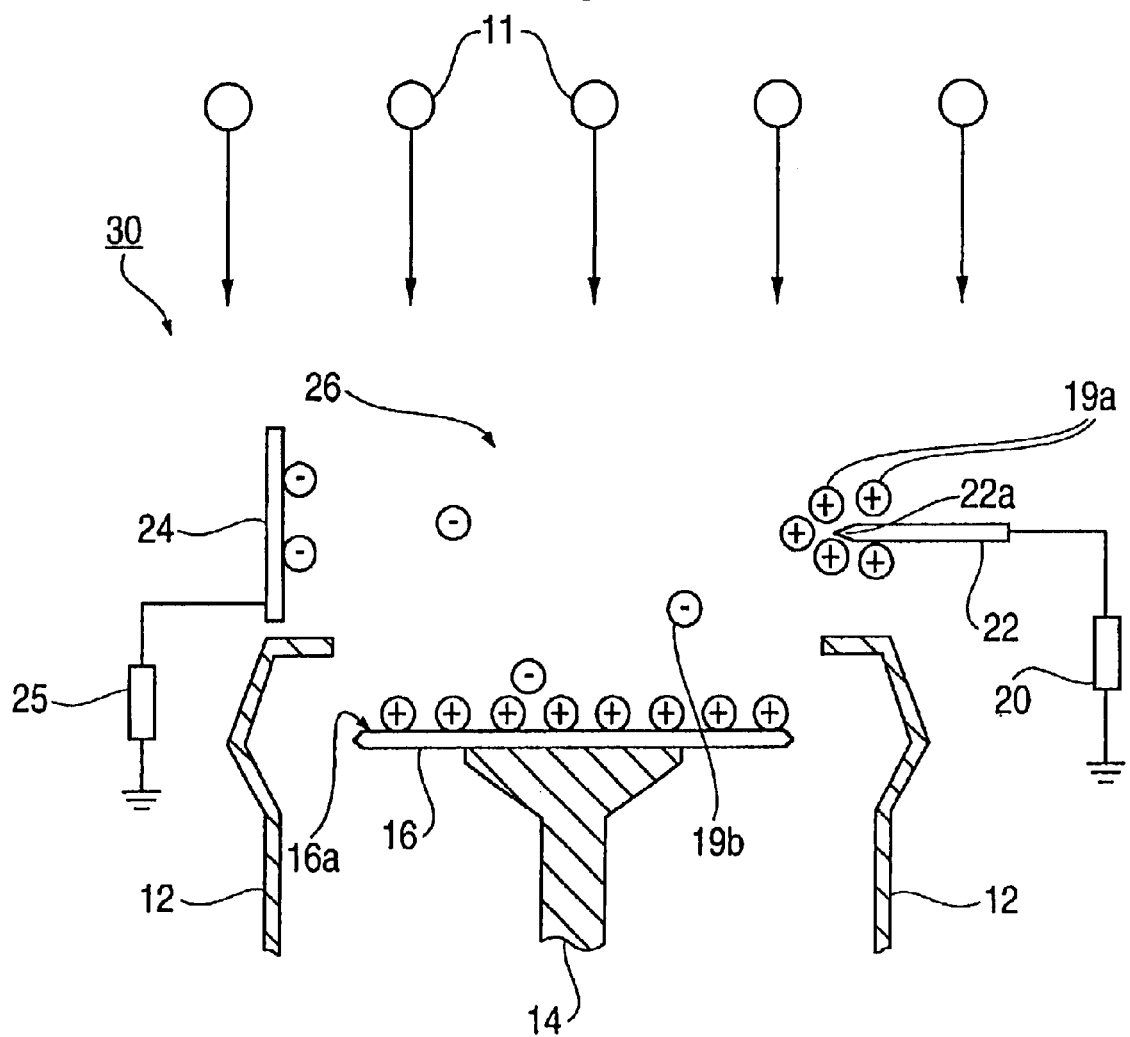
FIG. 2 is a cross section view of an apparatus according to a second preferred embodiment of the present invention.

A second preferred embodiment will be described hereinafter, referring to FIG. 2. The same elements mentioned above are marked at the same symbols and a description thereof is omitted. A cross sectional view of an apparatus 30 is shown in FIG. 2. FIG. 2 illustrates an outline of the apparatus.

Similar to the first preferred embodiment, the apparatus 30 of this embodiment includes a cylindrical container 12, a support portion 14, a down flow portion 11, an ion generator 22 and a nozzle (not shown).

In this preferred embodiment, a second electrode 24 is located over the cylindrical container 12 so as to face toward the tip 22a of the needle type electrode 22. An atmosphere 26 where ions are generated therein is sandwiched between the needle type electrode 22 and the second electrode 24. In this embodiment, a plate electrode 24 is used as the second electrode. The plate electrode 24 is connected to a second power supply 25 which supplies a voltage power to the plate electrode 24, as shown in FIG. 2. Otherwise the plate electrode 24 is directly connected to the ground. The second power supply 25 is also connected to the ground.

Similarly, when the surface 16a is positively charged by the friction between the surface 16a and the solution dropped from the nozzle, the power supply 20 supplies a negative voltage to the needle type electrode 22. In this preferred embodiment, the negative voltage is between −200 v and −500v. Therefore, the atmosphere around the needle type electrode 22 is ionized and a corona discharge occurs therein. As such, positive ions 19a and negative ions 19b are generated around the needle type electrode 18.

Also, most of the positive ions 19a gather around the needle type electrode 22. The negative ions 19b and electrons gather on the plate electrode 24 which is supplied with a positive voltage (less than 100V). Therefore, the kinetic speed of the negative ions 19b and the electrons is slowed down by the plate electrode 24. The electrons mainly combine with oxygen and become negative ions (19b). That is, more negative ions can be gained in the atmosphere.

The negative ions 19b are carried by the down flow to the surface 16a. As the surface 16a is positively charged, the negative ions 19b are combined with positive ions on the surface 16a. Therefore, the charges are extinguished from the surface 16a. That is, the static electricity on the semiconductor wafer can be eliminated.

Figure 3:
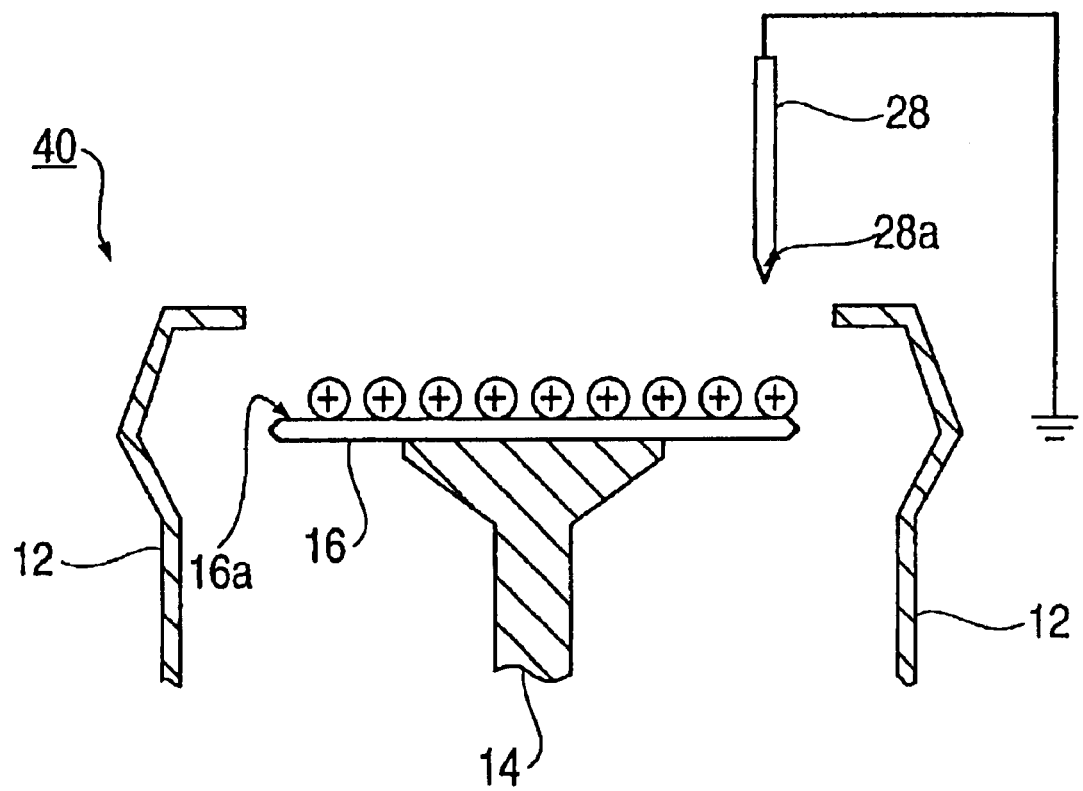
FIG. 3 is a cross section view of an apparatus according to a third preferred embodiment of the present invention.

A third preferred embodiment will be described hereinafter, referring to FIG. 3. The same elements mentioned above are marked at the same symbols and a description thereof is omitted. A cross sectional view of an apparatus 40 is shown in FIG. 3. FIG. 3 illustrates an outline of the apparatus.

The apparatus 40 of this embodiment includes a cylindrical container 12, a support portion 14, a discharge electrode 28 and a nozzle (not shown).

The discharge electrode 28 is comprised of a thin needle type electrode. The needle type electrode 28 is sharply pointed as shown in FIG. 3. The needle type electrode 28 is connected to a ground. The needle type electrode 18 is comprised of a conductive material. In this embodiment, the conductive material is copper, aluminum or iron.

In the case where the surface 16a is positively charged by the friction between the surface 16a and the solution dropped form the nozzle, the tip 28a of the discharge electrode 28 is laid to the surface 16a of the semiconductor wafer 16 so that the static charge on the surface 16a is discharged. Thereby, the static charge is removed from the semiconductor wafer 16.

In this embodiment, the discharge electrode 28 is approximated at a distance of 2 millimeters from the surface 16a. Thereby, the static charge on the surface can be discharged.

A fourth preferred embodiment will be described hereinafter, referring to FIG. 4 and FIG. 5. This embodiment is a variation of the third embodiment. The same elements mentioned above are marked at the same symbols and a description thereof is omitted. A cross sectional view of an apparatus 50 is shown in FIG. 4.

In this embodiment, a discharge electrode 32 is comprised of plural needle type electrodes 32x, as shown in FIG. 4 and FIG. 5. A plane view of the discharge electrode 32 is shown in FIG. 5.

The discharge electrodes 32 are comprised of thin needle type electrode 32x. The needle type electrodes 32xa are sharply pointed as shown in FIG. 4. The needle type electrodes 32x are connected to a ground. The needle type electrodes 32x are comprised of a conductive material. The conductive material is copper, aluminum or iron.

The plural needle type electrodes 32x are arranged in a discharge region 34 which has substantially the same width as the semiconductor wafer 16. Further, the needle type electrodes 32x are arranged perpendicular to the semiconductor wafer 16 at regular intervals. Suitable intervals are determined by a voltage applied to the needle type electrodes 32x and a distance between the surface 16a of the semiconductor wafer 16 and tips 32xa of the needle type electrodes 32x. The needle type electrodes 32x are fixed in a support substrate 36.

Also, the apparatus 50 of this embodiment includes a cylindrical container 12, a support portion 14 and a nozzle (not shown). The support portion 14 can move up and down in order to expose the semiconductor wafer 16 to the outside of the cylindrical container 12. The discharge electrode 32 is located above the semiconductor wafer 16 so that the discharge electrode 32 does not to interfere with the nozzle.

In the case where the surface 16a is positively charged by the friction between the surface 16a and the solution dropped from the nozzle, the support portion 14 is moved up to expose the semiconductor wafer 16 outside the cylindrical container 12.

The tips 32xa of the discharge electrode 32 are approximated at a distance of 2 millimeters from the surface 16a of the semiconductor wafer 16. This, state is then maintained for a few seconds. As such, the static charge on the semiconductor wafer 16 is discharged. Then, the discharge electrode 32 is moved away from the semiconductor wafer 16.

According to this embodiment, as the discharge electrode 32 is comprised of the plural thin electrodes 32x which correspond to the whole surface of the semiconductor wafer, the static charge can be removed from the semiconductor wafer in short time, as compared with the third embodiment.

The apparatus and methods of the invention for eliminating static electricity on a semiconductor wafer can be applied to each processing step which might generate a static charge on the semiconductor wafer or to each of a predetermined number of processing steps.

The present invention has been described with reference to illustrative embodiments, however, this description must not be considered to be confined only to the embodiments illustrated. Various modifications and changes of these illustrative embodiments and the other embodiments of the present invention will become apparent to one skilled in the art from reference to the description of the present invention. It is therefore contemplated that the appended claims will cover any such modifications or embodiments as fall within the true scope of the invention.

What is claimed is:

1. An apparatus for manufacturing semiconductor devices, comprising:
    a wafer support which supports a semiconductor wafer;
    an ion generator which supplies ions into an atmosphere above the semiconductor wafer;
    a down flow mechanism which causes the atmosphere above the semiconductor wafer to be fluid in a direction toward the semiconductor wafer such that the ions generated by the ion generator reach to a surface of the semiconductor wafer; and
    a second electrode which faces toward a thin electrode and slows down a kinetic speed of the ions;
    wherein the ion generator is the thin electrode which is connected to a power generator, and wherein the power generator supplies a power supply voltage to the thin electrode and is connected to a ground.

2. The apparatus for manufacturing semiconductor devices according to claim 1, wherein the thin electrode is a needle type electrode.

3. An apparatus for manufacturing semiconductor devices, comprising:
    a wafer support having an upper surface which supports a semiconductor wafer; and
    a discharge device which is located over the upper surface of the wafer support and is connected to a ground, wherein the discharge device removes static electricity on the semiconductor wafer when the discharge device is located at a static discharge position relative to the wafer support, and wherein the discharge device is comprised of a conductive material;
    wherein the wafer support is movable relative to the discharge device to and from the static discharge position.

4. The apparatus for manufacturing semiconductor devices according to claim 3, wherein the discharge device is a thin electrode.

5. The apparatus for manufacturing semiconductor devices according to claim 4, wherein the thin electrode is a needle type electrode.

6. The apparatus for manufacturing semiconductor devices according to claim 3, wherein the discharge device is comprised of a plurality of needle type electrodes, wherein the needle type electrodes are arranged perpendicular to the semiconductor wafer at regular intervals, and wherein the needle type electrodes are connected to the ground.

7. An apparatus for treating a semiconductor, comprising:
    a rotation device which rotates the semiconductor wafer;
    a nozzle which supplies a solution to a surface of the semiconductor wafer;
    a down flow device which causes an atmosphere above the surface to be fluid in a direction toward the surface;
    an ion generator which supplies ions into the atmosphere above the surface; and
    a second electrode which faces a thin electrode and slows a kinetic speed of the ions;
    wherein the ion generator is the thin electrode which is connected to a ground.

* * * * *